United States Patent
Kim et al.

(10) Patent No.: US 8,203,399 B2
(45) Date of Patent: Jun. 19, 2012

(54) TRANSFORMER CAPABLE OF REMOVING HARMONIC COMPONENTS

(75) Inventors: Ki Joong Kim, Jeollabuk-do (KR); Hyo Gun Bae, Gyunggi-do (KR); Joong Jin Nam, Seoul (KR); Jun Goo Won, Gyunggi-do (KR); Young Jean Song, Gyunggi-do (KR); Youn Suk Kim, Gyunggi-do (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 400 days.

(21) Appl. No.: 12/504,196

(22) Filed: Jul. 16, 2009

(65) Prior Publication Data

US 2010/0109806 A1    May 6, 2010

(30) Foreign Application Priority Data

Oct. 30, 2008    (KR) .................. 10-2008-0107272

(51) Int. Cl.
*H03H 7/01* (2006.01)
(52) U.S. Cl. ........................ 333/177; 333/185
(58) Field of Classification Search .................. 333/177, 333/185
See application file for complete search history.

(56) References Cited

U.S. PATENT DOCUMENTS

| | | | |
|---|---|---|---|
| 5,619,080 A * | 4/1997 | Pennington et al. | 307/105 |
| 5,814,901 A | 9/1998 | Ihara | |
| 6,842,086 B1 * | 1/2005 | Zennamo, Jr. | 333/175 |
| 7,305,223 B2 | 12/2007 | Liu et al. | |
| 2008/0042792 A1 * | 2/2008 | Chiu | 336/182 |

OTHER PUBLICATIONS

Office Action for corresponding Korean Application No. 10-2008-0107272 issued Aug. 24, 2010.

* cited by examiner

*Primary Examiner* — Robert Pascal
*Assistant Examiner* — Kimberly Glenn
(74) *Attorney, Agent, or Firm* — Lowe, Hauptman, Ham & Berner, LLP

(57) ABSTRACT

A transformer includes at least one input conductive line having both ends provided as input ports of a positive (+) signal and a negative (−) signal, respectively, one output conductive line disposed adjacent to the at least one input conductive line to be electromagnetically coupled to the at least one input conductive line, and having a first end connected to a ground, a first resonator disposed between a second end of the output conductive line and the ground, a second resonator having a first end connected to the second end of the output conductive line and a second end provided as an output port, and a third resonator connected in series between the first end of the output conductive line and the ground.

26 Claims, 3 Drawing Sheets

TRANSFORMER CAPABLE OF REMOVING HARMONIC COMPONENTS

CROSS-REFERENCE TO RELATED APPLICATIONS

This application claims the priority of Korean Patent Application No. 2008-0107272 filed on Oct. 30, 2008, in the Korean Intellectual Property Office, the disclosure of which is incorporated herein by reference.

BACKGROUND OF THE INVENTION

1. Field of the Invention

The present invention relates to a transformer, and more particularly, to a transformer adopting a structure of an integrated passive device (IPD) used in a complementary metal-oxide semiconductor (CMOS) power amplifier.

2. Description of the Related Art

In general, power amplifiers are used at Tx ports of mobile communication terminals, such as portable phones, to amplify the power of a Tx signal. The power amplifiers need to amplify a Tx signal to proper power. To control the output power of the power amplifier, a closed loop method or an open loop method may be used. As for the closed loop method, a transformer at an output port of a power amplifier detects a portion of an output signal, a Schottky diode converts the detected signal into DC current, and a comparator compares the DC current with a reference voltage. As for the open loop method, the power is regulated by sensing the voltage or current being applied to the power amplifier.

The closed loop method, which has been traditionally used, ensures precise power control but complicates circuit implementation and causes a deterioration in amplifier efficiency due to coupler loss. The open loop method allows simple circuit implementation and thus is being used in many cases, but fails to precisely regulate power.

Recently, circuit implementation in the closed loop method has been simplified due to the integration of components into an integrated circuit (IC). Also, with the performance enhancement of a control chip, the coupling value of directional couplers used for the closed loop method has been significantly lowered, thus greatly reducing coupler loss. Notably, the closed loop method that ensures precise power control is in current use in the Global System for Mobile communications (GSM) communication scheme where the ramping profile is considered important.

Studies are ongoing to effectively implement transformers controlling the output of power amplifiers. However, harmonic components are generated in an output signal when a transformer is used. Notably, when a transformer is configured as IPD employing a CMOS power amplifier, the characteristics of the harmonic components become complicated due to high output power.

SUMMARY OF THE INVENTION

An aspect of the present invention provides a transformer capable of removing harmonic components by using an additional resonant circuit.

According to an aspect of the present invention, there is provided a transformer including at least one input conductive line having both ends provided as input ports of a positive (+) signal and a negative (−) signal, respectively, one output conductive line disposed adjacent to the at least one input conductive line to be electromagnetically coupled to the at least one input conductive line, and having a first end connected to a ground, a first resonator disposed between a second end of the output conductive line and the ground, a second resonator having a first end connected to the second end of the output conductive line and a second end provided as an output port, and a third resonator connected in series between the first end of the output conductive line and the ground.

The first resonator may reduce the third harmonic component of a signal output from the output conductive line in a preset frequency band. The first resonator may include an inductor and a capacitor connected to each other in series.

The second resonator may reduce the third harmonic component of a signal output from the output conductive line in a preset frequency band. The second resonator may include an inductor and a capacitor connected to each other in parallel.

The third resonator may reduce the second harmonic component of a signal output from the output conductive line in a preset frequency band. The third resonator may include an inductor and a capacitor connected to each other in series.

According to another aspect of the present invention, there is provided a transformer including a laminated substrate, at least one input conductive line disposed on the substrate and having both ends provided as input ports of a positive (+) signal and a negative (−) signal respectively, one output conductive line disposed adjacent to the at least one input conductive line to be electromagnetically coupled to the at least one input conductive line, and having a first end connected to a ground, a first resonator disposed between a second end of the output conductive line and the ground, a second resonator having a first end connected to the second end of the output conductive line; and a second end provided as an output port, and a power supply pad disposed at one region of the at least one input conductive line. The at least one input conductive line has a portion disposed on a top layer of the laminated substrate and a remaining portion disposed on a different layer of the laminated substrate, and the portions on the different layers are connected through a via hole. The output conductive line has a portion disposed on the top layer of the laminated substrate and a remaining portion disposed on a different layer of the laminated substrate, so as not to be directly connected to the at least one input conductive line, and the portions on the different layers are connected through a via hole.

The first resonator may reduce the third harmonic component of a signal output from the output conductive line in a preset frequency band. The first resonator may include an inductor component and a capacitor component connected to each other in series.

The second resonator may reduce the third harmonic component of a signal output from the output conductive line in a preset frequency band. The second resonator may include an inductor component and a capacitor component connected to each other in parallel.

According to still another aspect of the present invention, there is provided a transformer including a laminated substrate, at least one input conductive line disposed on the substrate and having both ends provided as input ports of a positive (+) signal and a negative (−) signal respectively, one output conductive line disposed adjacent to the at least one input conductive line to be electromagnetically coupled to the at least one input conductive line, and having a first end connected to a ground, a first resonator disposed between a second end of the output conductive line and the ground, a second resonator having a first end connected to the second end of the output conductive line and a second end provided as an output port, and a third resonator connected in series between the one end of the output conductive line and the ground. The at least one input conductive line has a portion disposed on a top layer of the laminated substrate and a remaining portion disposed on a different layer of the laminated substrate, and the portions on the different layers are connected through a via hole. The output conductive line has a portion disposed on the top layer of the laminated substrate and a remaining portion disposed on a different layer of the laminated substrate, so as not to be directly connected to the at least one input conductive line, and the portions on the different layers are connected through a via hole.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1:
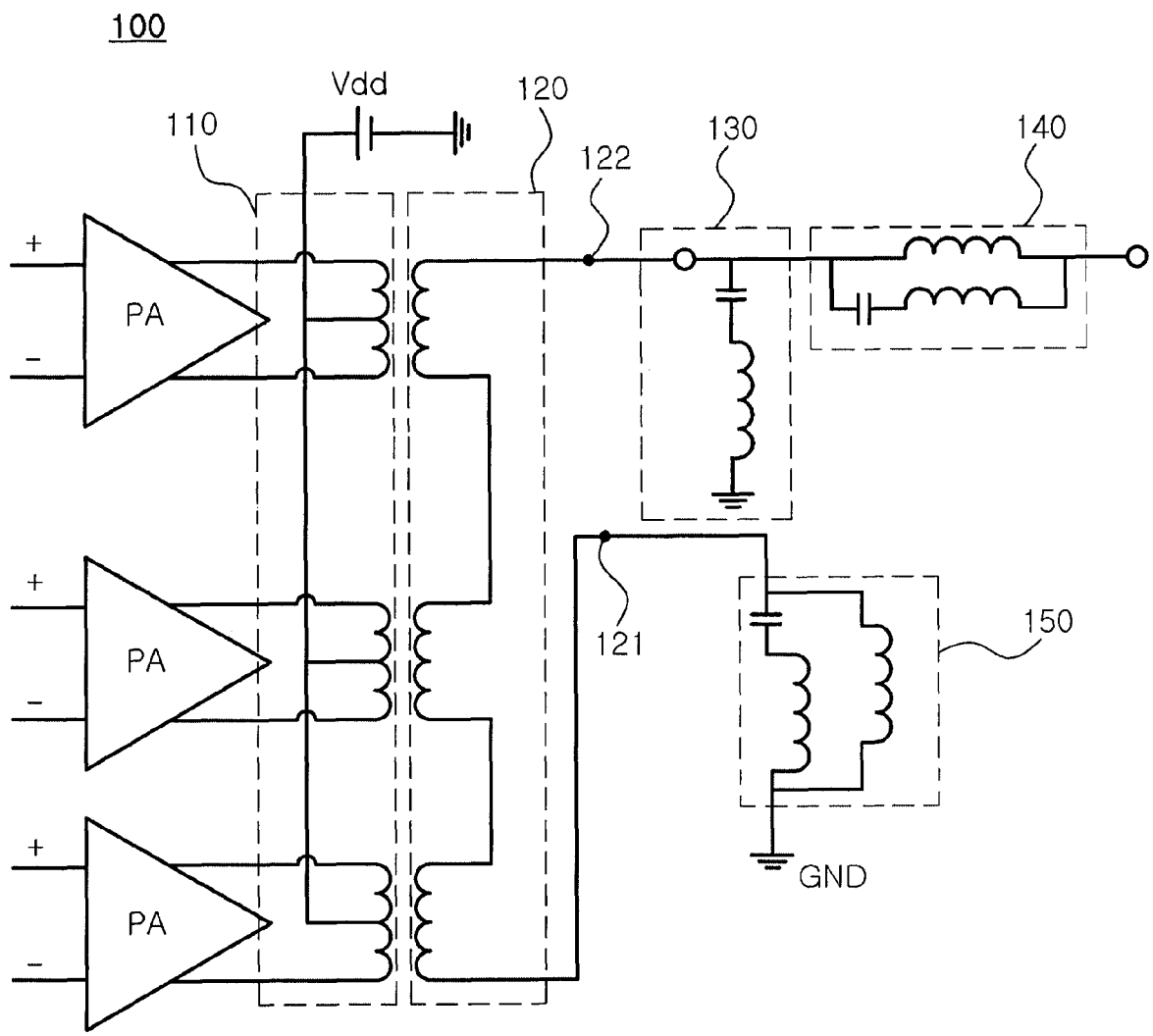
FIG. 1 is a circuit diagram of a transformer according to an exemplary embodiment of the present invention.

FIG. 1 is a circuit diagram of a transformer according to an exemplary embodiment of the present invention.

Referring to FIG. 1, a transformer 100 according to the embodiment of FIG. 1 may include an input conductive line 110, an output conductive line 120, a first resonator 130, and a second resonator 140.

The input conductive line 110 may include a plurality of input conductive lines each having both ends provided as input ports of a positive (+) signal and a negative (−) signal, respectively. In this embodiment, there may be three input conductive lines. Both ends of each of the three input conductive lines may be connected to a power amplifier (PA). In the transformer according to this embodiment, the input conductive line may be connected to a power amplifier implemented into a complementary metal oxide semiconductor (CMOS) type used for mobile communication terminals.

The output conductive line 120 may be disposed adjacent to at least one of the input conductive lines and electromagnetically coupled to the at least one of the input conductive lines. The output conductive line 120 may have one end 121 connected to the ground GND. According to this embodiment, the output conductive line 120 may be disposed to be electrically coupled to each of the three input conductive lines.

The first resonator 130 may be formed between the other end 122 of the output conductive line 120 and the ground. The first resonator 130 may serve to reduce the third harmonic component of a signal output from the output conductive line 120 in a preset frequency band. According to this embodiment, the first resonator 130 may include an inductor and a capacitor connected to each other in series so as to reduce the third harmonic component of a signal output from the output conductive line 120 in the GSM 850 band. The circuit configuration of the first resonator 130 may be variously realized, provided that the first resonator 130 performs the aforementioned function.

The second resonator 140 may have one end connected to the other end 122 of the output conductive line 120 and the other end provided as an output port. The second resonator 140 may serve to reduce the third harmonic component of the signal output from the output conductive line in the preset frequency band. According to this embodiment, the second resonator 140 may include a first circuit including an inductor and a capacitor connected to each other in series, and an inductor connected to the first circuit in parallel so as to reduce the third harmonic component of the signal output from the output conductive line 120 in the GSM 850 band. The circuit configuration of the second resonator 140 may be variously realized, provided that the second resonator 140 performs the aforementioned function.

The second resonator 140 may be used for output matching of the signal output from the output conductive line 120. The output matching may be obtained by controlling the inductance and capacitance of the second resonator 140.

According to this embodiment, by adding the second resonator 140, the third harmonic component of the signal output from the output conductive line 120 can be more effectively reduced. Accordingly, output voltage and efficiency can be improved.

The transformer 100 according to this embodiment may further include a third resonator 150 connected in series between the one end 121 of the output conductive line 120 and the ground GND.

The third resonator 150 may serve to reduce the second harmonic component of the signal output from the output conductive line 120 in the preset frequency band. According to this embodiment, the third resonator 150 may be configured as a notch circuit, including a first circuit including an inductor and a capacitor connected to each other in series and an inductor connected to the first circuit in parallel so as to reduce the second harmonic component of the signal output from the output conductive line 120 in the GSM 850 band. The circuit configuration of the third resonator 150 may be variously realized, provided that the third resonator 150 performs the aforementioned function.

According to this embodiment, by adding the third resonator 150, the second harmonic component of the signal output from the output conductive line 120 can be reduced. Accordingly, output voltage and efficiency can be improved.

Figure 2:
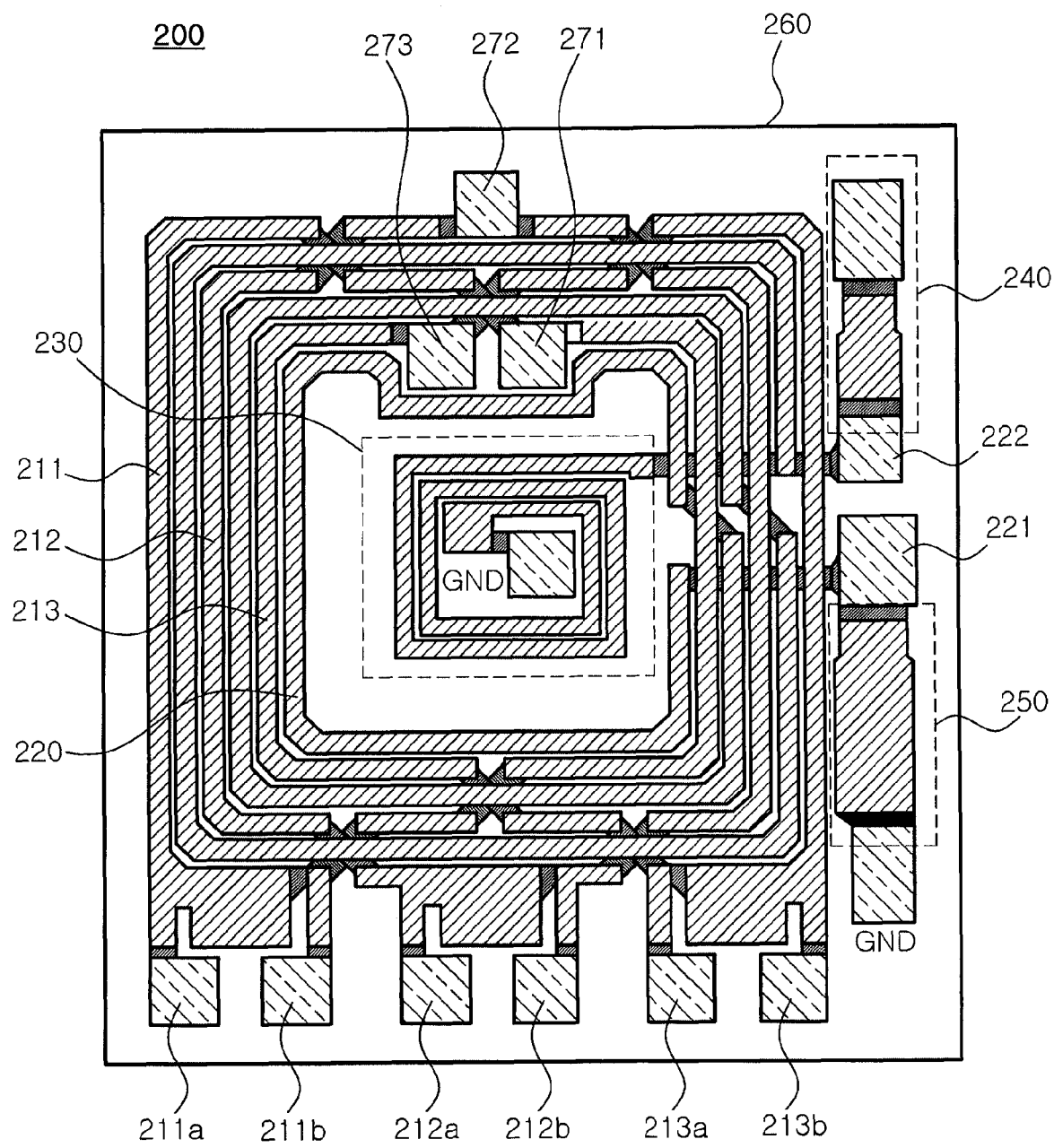
FIG. 2 is a plan view of a transformer according to another exemplary embodiment of the present invention.

FIG. 2 is a plan view of a transformer according to another exemplary embodiment of the present invention.

Referring to FIG. 2, a transformer 200 according to this embodiment includes a laminated substrate 260, input conductive lines 211, 212 and 213, an output conductive line 220, a first resonator 230 and a second resonator 240.

The laminated substrate 260 may be a dielectric substrate having a plurality of layers. According to this embodiment, the input conductive lines 211, 212 and 213 and the output conductive line 220 may each have a portion formed on the top lamination layer of the laminated substrate and another portion formed on a different lamination layer, such that each of the input conductive lines 211, 212 and 213 and the output conductive line 220 do not directly contact each other. The portions of the input and output conductive lines 211, 212, 213 and 220 on different lamination layers may be connected through a via hole. A substrate used for high frequency applications may be used as the laminated substrate 260.

The input conductive lines 211, 212 and 213 may be formed on the laminated substrate 260, with each having both ends provided as input ports of a positive (+) signal and a negative (−) signal, respectively. The plurality of input conductive lines may each have a portion formed on the top lamination layer of the laminated substrate 260, and the remaining portion formed on a different lamination layer. The portions of corresponding input conductive lines on different lamination layers may be connected through a via hole. According to this embodiment, there may be three input conductive lines. Both ends of each of the three input conductive lines may be connected to a power amplifier (PA). In the transformer of this embodiment, the input conductive line may be connected to a CMOS power amplifier used for a mobile communication terminal.

The output conductive line 220 may be disposed adjacent to each of the input conductive lines 211, 212 and 213 to be electromagnetically coupled to the input conductive lines 211, 212 and 213. The output conductive line 220 may have one end 221 connected to the group GND.

According to this embodiment, the three input conductive lines 211, 212 and 213 may form loops having the same center on the laminated substrate 260, and the output conductive line 220 may form a loop having the same center on the laminated substrate 260 as the loops of the input conductive lines 211, 212 and 213. Also, the output conductive line 220 may be disposed between the three input conductive lines 211, 212 and 213 for electromagnetic coupling with each of the three input conductive lines 211, 212 and 213.

The output conductive line 220 may have a portion formed on the top lamination layer of the laminated substrate 260 and the remaining portion formed on a different lamination layer such that the output conductive line 220 is not directly connected with at least one of the input conductive lines 211, 212 and 213. The portions of the output conductive line 220 on the different layers may be connected through a via hole.

The first resonator 230 may be formed between the other end 222 of the output conductive line 220 and the ground. According to this embodiment, the first resonator 230 may be formed in the central region of the loops of the input conductive lines 211, 212 and 213 and the output conductive line 220. The first resonator 230 may serve to reduce the third harmonic component of a signal output from the output conductive line 220 in a preset frequency band. According to this embodiment, the first resonator 230 may include an inductor component and a capacitor component connected to each other in series so as to reduce the third harmonic component of a signal output from the output conductive line in the GSM 850 band. The circuit configuration of the first resonator 230 may be variously realized, provided that the first resonator 230 performs the aforementioned function.

The inductor component of the first resonator 230 may be configured as a conductive pattern formed on the laminated substrate 260 or as a conductive wire. The capacitor component of the first resonator 230 may be realized by forming overlapping conductive patterns on different layers of the laminated substrate 260.

The second resonator 240 may have one end connected to the other end 222 of the output conductive line 220 and the other end provided as an output port. The second resonator 240 may serve to reduce the third harmonic component of the signal output from the output conductive line 220 in the preset frequency band. According to this embodiment, the second resonator 240 may include a plurality of inductor components and capacitor components connected to each other in series, in parallel or a combination thereof in order to reduce the third harmonic component of the signal output from the output conductive line 220 in the GSM 850 band. The circuit configuration of the second resonator 240 may be variously realized, provided that the second resonator 240 performs the aforementioned function.

The inductor components of the second resonator 240 may each be realized as a conductive pattern on the laminated substrate 260 or as a conductive wire. The capacitor components of the second resonator 240 may each be realized by forming overlapping patterns on different layers of the laminated substrate 260.

The second resonator 240 may be used for output matching of a signal output from the output conductive line 220. The output matching may be obtained by controlling the inductance and capacitance of the second resonator 240.

According to this embodiment, by adding the second resonator 240, the third harmonic component of the signal output from the output conductive line 220 can be more effectively reduced. Accordingly, output voltage and efficiency can be improved.

The transformer 200, according to this embodiment, may further include a third resonator 250 connected between the one end 221 of the output conductive line 220 and the ground in series.

The third resonator 250 may serve to reduce the second harmonic component of the signal output from the output conductive line 220 in the preset frequency band. According to this embodiment, the third resonator 250 may be configured as a notch circuit, including a plurality of inductor components and capacitor components connected to each other in series, in parallel or a combination thereof so as to reduce the second harmonic component of the signal output from the output conductive line 220 in the GSM 850 band. The circuit configuration of the third resonator 250 may be variously realized, provided that the third resonator 250 performs the aforementioned function.

The inductor components of the third resonator 250 may each be realized as a conductive pattern on the laminated substrate 260 or as a conductive wire. The capacitor components of the third resonator 250 may each be realized by forming overlapping conductive patterns on different layers of the laminated substrate 260.

According to this embodiment, by adding the third resonator 250, the second harmonic component of the signal output from the output conductive line 260 may be reduced. Accordingly, output voltage and efficiency can be improved.

According to this embodiment, power supply pads 271, 272 and 273 may be formed at portions of the three input conductive lines 211, 212 and 213, respectively. The power supply pads 271, 272 and 273 may be provided as terminals for power supply to the input conductive lines 211, 212 and 213, respectively. Each of the power supply pads 271, 272 and 273 may be located at a portion at which the electric radio frequency (RF) swing potential is 0V in a corresponding one of the input conductive lines 211, 212 and 213. The CMOS power amplifier uses the AC ground because there is no DC ground. Thus, the RF swing potential of 0 V refers to the AC ground.

The power supply pads 271, 272 and 273 may be disposed such that the interval between each of the power supply pads 271, 272 and 273 and the output conductive line 220 is the same as the interval between the output conductive line 220 and a corresponding one of the input conductive lines 211, 212 and 213 including the power supply pads 271, 272 and 273 respectively.

Because of the power supply pads 271, 272 and 273 formed directly on the input conductive patterns 211, 212 and 213 respectively, there is no need to form a separate conductive wire for the formation of power supply pads. Accordingly, undesired electromagnetic coupling, which may be caused by other conductive wires, can be obviated.

Figure 3:
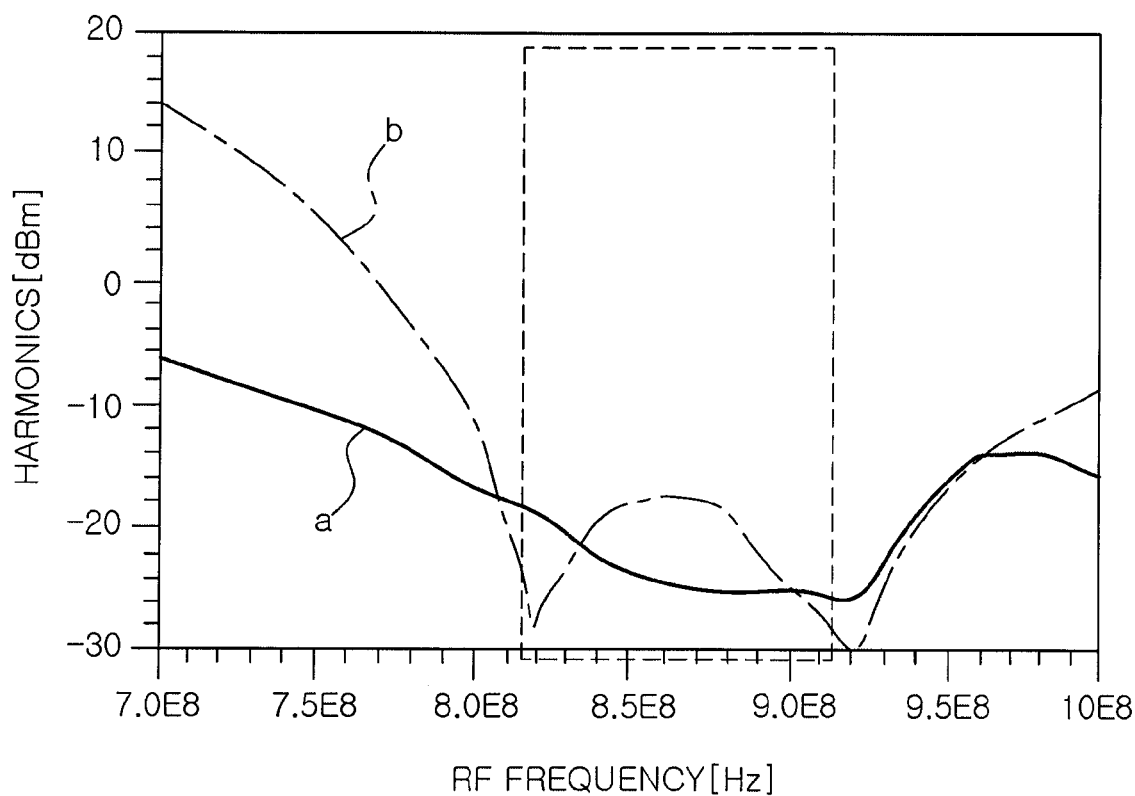
FIG. 3 is a graph showing harmonic components output from an output conductive line of a transformer according to an exemplary embodiment of the present invention.

FIG. 3 is a graph showing harmonic components output from an output conductive line of a transformer according to an exemplary embodiment of the present invention.

Referring to FIG. 3, curve 'a' indicates the second harmonic component of a signal output from the output conductive line, and curve 'b' indicates the third harmonic component of the signal output from the output conductive line. In the transformer according to this embodiment, the second harmonic component and the third harmonic component do not exceed −10 dBm in the GSM 850 band, that is, a band from about 800 MHz to about 900 MHz. Accordingly, the output deterioration caused by the harmonic components can be prevented.

According to the present invention, an additional resonant circuit is added to remove the harmonic components, so that output power and efficiency can be improved.

While the present invention has been shown and described in connection with the exemplary embodiments, it will be apparent to those skilled in the art that modifications and variations can be made without departing from the spirit and scope of the invention as defined by the appended claims.

What is claimed is:

1. A transformer, comprising:
   at least one input conductive line having both ends provided as input ports of a positive (+) signal and a negative (−) signal, respectively;
   one output conductive line disposed adjacent to the at least one input conductive line to be electromagnetically coupled to the at least one input conductive line, and having a first end connected to a ground;
   a first resonator disposed between a second end of the output conductive line and the ground;
   a second resonator having a first end connected to the second end of the output conductive line and a second end provided as an output port; and
   a third resonator connected in series between the first end of the output conductive line and the ground.

2. The transformer of claim 1, wherein the first resonator reduces a third harmonic component of a signal output from the output conductive line in a preset frequency band.

3. The transformer of claim 2, wherein the first resonator comprises an inductor and a capacitor connected to each other in series.

4. The transformer of claim 1, wherein the second resonator reduces a third harmonic component of a signal output from the output conductive line in a preset frequency band.

5. The transformer of claim 4, wherein the second resonator comprises:
   a first inductor and a capacitor connected to each other in series; and
   a second inductor connected to the first inductor and the capacitor in parallel.

6. The transformer of claim 1, wherein the third resonator reduces a second harmonic component of a signal output from the output conductive line in a preset frequency band.

7. The transformer of claim 6, wherein the third resonator comprises:
   a first inductor and a capacitor connected to each other in series; and
   an inductor connected to the first inductor and the capacitor in parallel.

8. The transformer of claim 1, wherein both a second harmonic component and a third harmonic component of a signal output from the output conductive line are lower than −10 dBm.

9. A transformer, comprising:
   a laminated substrate;
   at least one input conductive line disposed on the substrate and having both ends provided as input ports of a positive (+) signal and a negative (−) signal, respectively;
   one output conductive line disposed adjacent to the at least one input conductive line to be electromagnetically coupled to the at least one input conductive line, and having a first end connected to a ground;
   a first resonator disposed between a second end of the output conductive line and the ground;
   a second resonator having a first end connected to the second end of the output conductive line, and a second end provided as an output port; and
   a power supply pad disposed at one region of the at least one input conductive line, wherein
   the at least one input conductive line has a portion disposed on a top layer of the laminated substrate and a remaining portion disposed on a different layer of the laminated substrate, and the portions on the different layers are connected through a via hole, and
   the output conductive line has a portion disposed on the top layer of the laminated substrate and a remaining portion disposed on a different layer of the laminated substrate, so as not to be directly connected to the at least one input conductive line, and the portions on the different layers are connected through a via hole.

10. The transformer of claim 9, wherein the power supply pad is placed at a portion of the at least one input conductive line at which an electric radio frequency (RF) swing potential is 0 V.

11. The transformer of claim 9, wherein the first resonator reduces a third harmonic component of a signal output from the output conductive line in a preset frequency band.

12. The transformer of claim 11, wherein the first resonator comprises an inductor component and a capacitor component connected to each other in series.

13. The transformer of claim 9, wherein the second resonator reduces a third harmonic component of a signal output from the output conductive line in a preset frequency band.

14. The transformer of claim 13, wherein the second resonator comprises:
   a first inductor component and a capacitor component connected to each other in series; and
   a second inductor component connected to the first inductor component and the capacitor component in parallel.

15. The transformer of claim 9, further comprising:
   a third resonator connected in series between the first end of the output conductive line and the ground.

16. The transformer of claim 15, wherein the third resonator reduces a second harmonic component of a signal output from the output conductive line in a preset frequency band.

17. The transformer of claim 16, wherein the third resonator comprises:
   a first inductor component and a capacitor component connected to each other in series; and
   a second inductor component connected to the first inductor component and the capacitor component in parallel.

18. The transformer of claim 15, wherein both a second harmonic component and a third harmonic component of a signal output from the output conductive line are lower than −10 dBm.

19. A transformer, comprising:
   a laminated substrate;
   at least one input conductive line disposed on the substrate and having both ends provided as input ports of a positive (+) signal and a negative (−) signal, respectively;
   one output conductive line disposed adjacent to the at least one input conductive line to be electromagnetically coupled to the at least one input conductive line, and having a first end connected to a ground;

a first resonator disposed between a second end of the output conductive line and the ground;

a second resonator having a first end connected to the second end of the output conductive line, and a second end provided as an output port; and a third resonator connected in series between the first end of the output conductive line and the ground, wherein the at least one input conductive line has a portion disposed on a top layer of the laminated substrate and a remaining portion disposed on a different layer of the laminated substrate, and the portions on the different layers are connected through a via hole, and the output conductive line has a portion disposed on the top layer of the laminated substrate and a remaining portion disposed on a different layer of the laminated substrate, so as not to be directly connected to the at least one input conductive line, and the portions on the different layers are connected through a via hole.

20. The transformer of claim 19, wherein the third resonator reduces a second harmonic component of a signal output from the output conductive line in a preset frequency band.

21. The transformer of claim 20, wherein the third resonator comprises:

a first inductor component and a capacitor component connected to each other in series; and a second inductor component connected to the first inductor component and the capacitor component in parallel.

22. The transformer of claim 19, wherein the first resonator reduces a third harmonic component of a signal output from the output conductive line in a preset frequency band.

23. The transformer of claim 22, wherein the first resonator comprises an inductor component and a capacitor component connected to each other in series.

24. The transformer of claim 19, wherein the second resonator reduces a third harmonic component of a signal output from the output conductive line in a preset frequency band.

25. The transformer of claim 24, wherein the second resonator comprises:

a first inductor component and a capacitor component connected to each other in series; and a second inductor component connected to the first inductor component and the capacitor component in parallel.

26. The transformer of claim 19, wherein both a second harmonic component and a third harmonic component of a signal output from the output conductive line are lower than −10 dBm.

* * * * *